United States Patent
Kanetsuki et al.

(10) Patent No.: US 6,893,970 B2
(45) Date of Patent: May 17, 2005

(54) PLASMA PROCESSING METHOD

(75) Inventors: Norio Kanetsuki, Tenri (JP); Tatsushi Yamamoto, Ikoma-gun (JP); Masaki Hirayama, Sendai (JP); Tadahiro Ohmi, Sendai (JP)

(73) Assignees: Sharp Kabushiki Kaisha, Osaka (JP); Tadahiro Ohmi, Miyagi (JP)

( * ) Notice: Subject to any disclaimer, the term of this patent is extended or adjusted under 35 U.S.C. 154(b) by 0 days.

(21) Appl. No.: 10/015,446

(22) Filed: Dec. 12, 2001

(65) Prior Publication Data
US 2002/0084255 A1 Jul. 4, 2002

(30) Foreign Application Priority Data
Dec. 15, 2000 (JP) ........................................ 2000-382020

(51) Int. Cl.⁷ .......................................... H01L 21/302
(52) U.S. Cl. ...................... 438/706; 438/710; 438/712; 438/714; 216/67
(58) Field of Search .............................. 438/706, 710, 438/712, 714, 720, 713; 216/57, 58, 67, 72, 75

(56) References Cited

U.S. PATENT DOCUMENTS

| | | | | |
|---|---|---|---|---|
| 4,687,543 A | * | 8/1987 | Bowker | 438/733 |
| 5,153,754 A | * | 10/1992 | Whetten | 359/59 |
| 5,658,820 A | * | 8/1997 | Chung | 438/3 |
| 5,827,437 A | * | 10/1998 | Yang et al. | 216/77 |
| 5,830,807 A | * | 11/1998 | Matsugana et al. | 438/714 |
| 6,004,884 A | * | 12/1999 | Abraham | 438/714 |
| 6,156,663 A | * | 12/2000 | Watanabe et al. | 438/695 |
| 6,328,848 B1 | * | 12/2001 | Hsia et al. | 156/345.11 |

FOREIGN PATENT DOCUMENTS

| | | |
|---|---|---|
| JP | 9-82687 | 3/1997 |
| JP | 09-082687 | 3/1997 |
| JP | 09-199480 | 7/1997 |
| JP | 11-111702 | 4/1999 |
| JP | 2000-216161 | 8/2000 |
| JP | 2000-349253 | 12/2000 |
| KR | 1998-050124 | 9/1998 |
| KR | 2000-0045459 | 7/2000 |

* cited by examiner

*Primary Examiner*—Lan Vinh
(74) *Attorney, Agent, or Firm*—David C. Conlin; David A. Tucker; Edwards & Angell, LLP.

(57) ABSTRACT

According to a plasma processing method, a process gas supplied into a process chamber is used to generate plasma from the process gas and process a substrate placed in the process chamber by means of the plasma. The substrate includes stacked films of at least two types to be etched by the plasma, and, according to any of the films that is to be etched, a change is made in the process gas in the plasma generation period. Accordingly, the time required for any process except for the main plasma process can be shortened so that the total time for the entire plasma process can be shortened to improve the processing speed.

11 Claims, 7 Drawing Sheets

TAPER ANGLE

PLASMA PROCESSING METHOD

BACKGROUND OF THE INVENTION

1. Field of the Invention

The present invention relates to plasma processing methods. In particular, the present invention relates to a plasma processing method used for manufacturing semiconductor or liquid crystal display devices, for example.

2. Description of the Background Art

A plasma processing apparatus has been used for a process of manufacturing a liquid crystal display device or semiconductor device, for example. In the manufacturing process, plasma is used for film deposition, etching and ashing processes for example. Such a plasma processing apparatus is required to provide a stable plasma acting over the entire substrate plane to be processed, in order to process the plane in a uniform and stable manner, for example, in order to uniformly deposit a film on the plane.

Recently, in the fields of semiconductor device, liquid crystal and the like, a typical example thereof being a semiconductor memory device, substrates have considerably been increased in size. In particular, for a TFT (Thin Film Transistor) liquid crystal display device, a substrate may be employed that has its size ranging from 500 mm×500 mm to 1 m×1 m or greater. Here, it is required to use a plasma processing method according to which a stable plasma acts on the entire plane of such a large-size substrate to be processed, in order to enhance the uniformity within the processed plane of the substrate and increase the speed of processing the plane.

FIG. 6 is a schematic cross section showing a structure of a general plasma processing apparatus. Referring to FIG. 6, an operation of the plasma processing apparatus is briefly described.

A substrate 8 to be processed is transported into a vacuum process chamber 1. An ambient gas within vacuum process chamber 1 is thereafter discharged by exhaust means (exhaust tube 11, control valve 12 and turbo pump 13). The inside of vacuum process chamber 1 is accordingly maintained in a vacuum state. Then, a process gas is provided from a process gas source 6 through a process gas supply unit 7 into vacuum process chamber 1. Simultaneously, a substrate holder 9 and substrate 8 are moved to a desired position by lifting/lowering means 10.

On the other hand, a microwave generated by a plasma exciting power source 5 is propagated to a microwave entrance window 3 through a waveguide 4 connected to plasma exciting power source 5 and an opening on one end of waveguide 4. The microwave is further propagated from microwave entrance window 3 to a dielectric plate 2. The microwave is then radiated almost uniformly from dielectric plate 2 to a region facing the entire surface of substrate 8 in vacuum process chamber 1.

The microwave radiated into vacuum process chamber 1 excites the reactant gas to generate plasma. After the plasma is generated, a high-frequency power source 14 applies a bias from substrate holder 9 to substrate 8. The plasma thus produced can be used to process the surface of substrate 8. For example, by means of the plasma, a film can be deposited on the substrate surface or ashing can be performed thereon.

The end of the plasma process is determined by measuring any change in the radiation intensity of any substance in the plasma by using an optical sensor 15 attached to vacuum process chamber 1. Specifically, a signal indicating the radiation intensity change measured by optical sensor 15 is supplied through an arithmetic processing unit 16 to a microwave source control unit 17 for example, and accordingly the plasma is stopped from being generated.

In this way, simultaneously with supply of the process gas to the entire surface of substrate 8, the microwave is radiated uniformly thereto from dielectric plate 2 so that a substantially uniform plasma can be produced in the region facing the entire surface of substrate 8.

FIG. 7 is a flowchart illustrating a conventional plasma processing method. Referring to FIGS. 6 and 7, substrate 8 is transported into vacuum process chamber 1 (step S101, hereinafter indicated without "step"). Then, an ambient gas within vacuum process chamber 1 is discharged to generate a vacuum (S102). A process gas is thereafter supplied into vacuum process chamber 1 and the pressure in vacuum process chamber 1 is adjusted to a predetermined pressure (S103). Then, a microwave energy, for example, is radiated into vacuum process chamber 1 to excite the process gas and generate plasma. The generated plasma is used for performing a desired process such as etching for a predetermined time (S104 and S105). After this, supply of the microwave energy is stopped, and subsequently the reactant gas is discharged to produce a vacuum within vacuum process chamber 1 (S106). Then, the processed substrate 8 is transported out of vacuum process chamber 1 (S107) and accordingly the successive steps of the process are completed.

Suppose that substrate 8 to be processed is formed of stacked films including a Ti (titanium)-based thin film and an Al (aluminum) film and this substrate 8 is dry-etched by a process gas which is a mixture gas of $Cl_2$ (chlorine) and Ar (argon). In this case, a problem as described below could arise.

It is known that the rate of etching the stacked films increases if the ratio of the $Cl_2$ gas is raised. When a process gas containing $Cl_2$ of a greater ratio is supplied to etch the Al film of the stacked films, a stable plasma can be produced. However, the plasma could become unstable when the Ti-based thin film is etched. For example, the plasma could flicker. Then, the stacked films may be processed by lowering the ratio of $Cl_2$ with the purpose of causing a stable discharge. However, this means that the ratio of $Cl_2$ which directly contributes to etching decreases so that the etching rate deteriorates.

In order to solve the problem above, a method is devised according to which an etching process is divided into two stages and the stacked films are respectively processed under different plasma generating conditions. Specifically, the Ti-based thin film is etched with a low $Cl_2$ flow rate while the Al film is etched with a high $Cl_2$ flow rate in order to render discharge stable and enhance the processing speed (etching rate). Such an etching method using the process divided into two stages is disclosed in Japanese Patent Laying-Open No. 11-111702 for example which shows, as a conventional technique, a process as shown in FIG. 8 employed with the purposes of controlling a tapered shape of a sidewall of an etched film and enhancing the processing speed.

Referring to FIGS. 6 and 8, as the process shown in FIG. 7, substrate 8 is transported into the chamber (S101), and the air within the chamber is discharged for generating a vacuum (S102). Then, stacked films of substrate 8 are etched. The process of etching the stacked films is divided into two stages, i.e., a first etching and a second etching. In the first etching stage, a gas for the first etching is supplied and the pressure is adjusted (S203) and thereafter the first etching is carried out (S204 and S205). After the first etching, application of microwave power is temporarily stopped and the second etching is thereafter carried out. As the first etching, a gas for the second etching is supplied and the pressure is adjusted (S206). The second etching is thereafter carried out (S207, S208).

After the etching, the air is discharged (S109) as done for the process in FIG. 7 and substrate 8 is transported out of the chamber.

The etching method shown in FIG. 8 has a problem concerning the processing speed as described below.

According to the process in FIG. 8, the microwave power is once stopped from being applied, between the first etching stage and the second etching stage. Therefore, there is an additional time to wait for vanishing of the plasma as well as regeneration of plasma. Then, the extra time is added to the time for the plasma process. Consequently, the total time from supply of substrate 8 to removal thereof after the plasma process increases, which leaves a problem in terms of enhancement of the processing speed.

SUMMARY OF THE INVENTION

The present invention has been made for solving the problems discussed above. One object of the present invention is to provide a plasma processing method which makes it possible to shorten the plasma process time and cycle time and control the shape produced by dry-etching.

According to a plasma processing method of the present invention, a process gas supplied into a process chamber is used to generate plasma from the process gas and process a substrate placed in the process chamber by means of the plasma. The substrate includes stacked films of at least two types to be etched by the plasma, and, according to any of the films that is to be etched, a change is made in the process gas in a plasma generation period.

According to the plasma processing method of the invention, the process gas is changed in the plasma generation period (without stopping the plasma generation). Therefore, the waiting time required for extinguishment of the plasma and regeneration thereof which is necessary for the conventional process can be saved. Then, the total time required for the entire plasma process can be decreased which enhances the processing speed.

Preferably, according to the plasma processing method, in the plasma generation period, a change is made in a bias voltage applied to the substrate together with the change made in the process gas.

When a process gas of a high etching rate is used to etch a resist and a metal film, the etching rate of the metal film becomes higher than the etching rate of the photoresist so that the taper angle formed by a sidewall of the etched film could become greater. On the other hand, simultaneously with the change made in the mixture ratio or gas type of the process gas, the bias output can be increased to enhance the processing speed and control the taper shape formed into a desired one.

Preferably, according to the plasma processing method, in the plasma generation period, a change is made in a plasma generating condition for stably maintaining generation of the plasma, together with the change made in the process gas.

Even if the process gas is changed in the plasma generation period, the plasma can stably be maintained and an enhancement of the etching rate as well as control of the taper shape are possible.

Preferably, according to the plasma processing method, the change in the plasma generating condition for stably maintaining generation of the plasma is made simultaneously with or prior to the change made in the process gas.

Even if the process gas is changed in the plasma generation period, the plasma can stably be maintained and an enhancement of the etching rate as well as control of the taper shape are possible.

Preferably, according to the plasma processing method, the plasma generating condition for stably maintaining generation of the plasma is pressure of the process gas within the process chamber.

When the plasma generating condition is changed, the plasma state could become unstable depending on the condition. However, discharge can stably be maintained by controlling the pressure of the process gas within the process chamber.

Preferably, according to the plasma processing method, the plasma generating condition for stably maintaining generation of the plasma is output of a plasma exciting power source.

When the plasma generating condition is changed, the plasma state could become unstable depending on the condition. However, discharge can stably be maintained by increasing the output of the plasma exciting power source.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS

Embodiments of the present invention are now described in conjunction with the drawings.

First Embodiment

Figure 1:
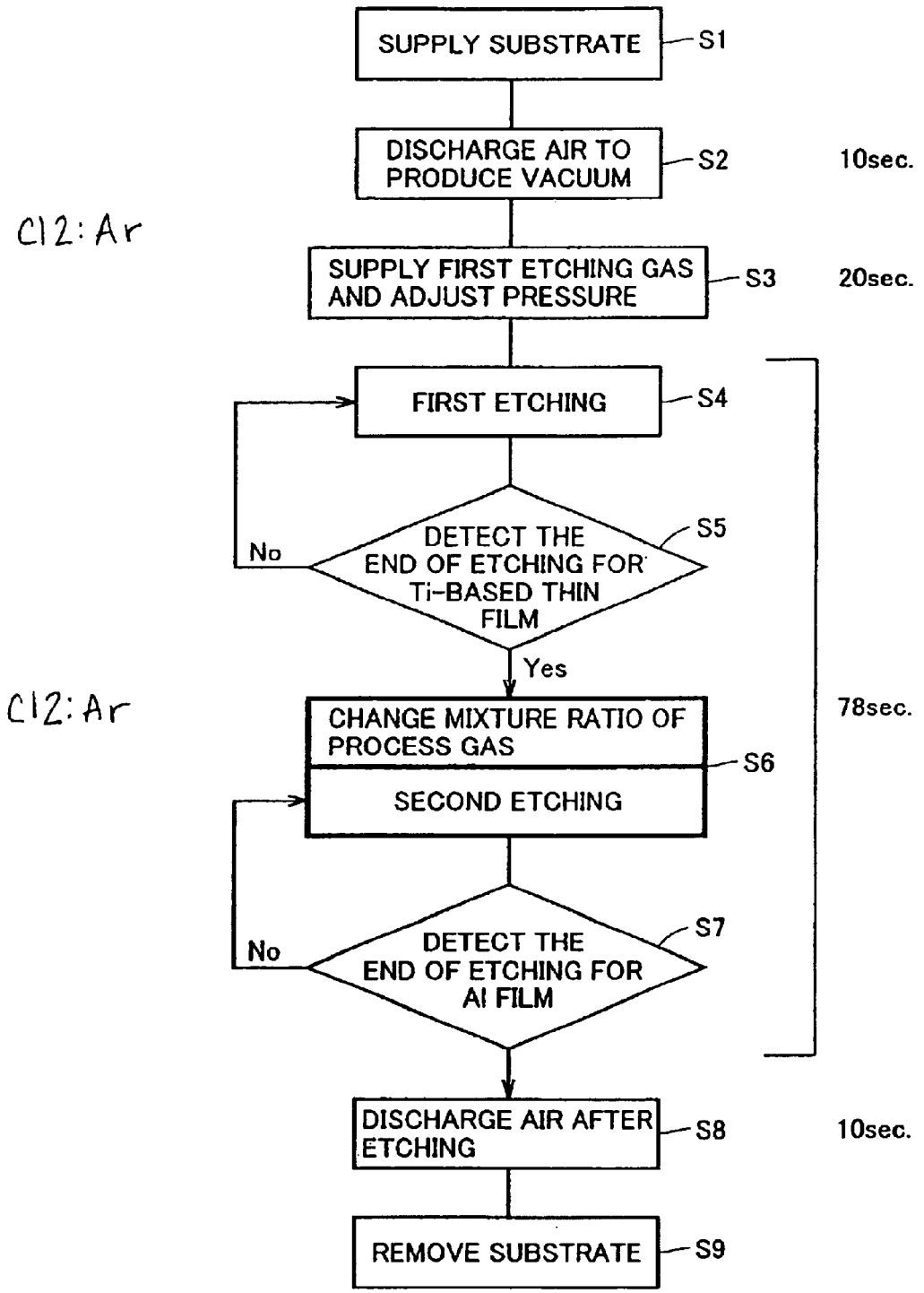
FIG. 1 is a flowchart illustrating a plasma processing method according to a first embodiment of the present invention.
Figure 6:
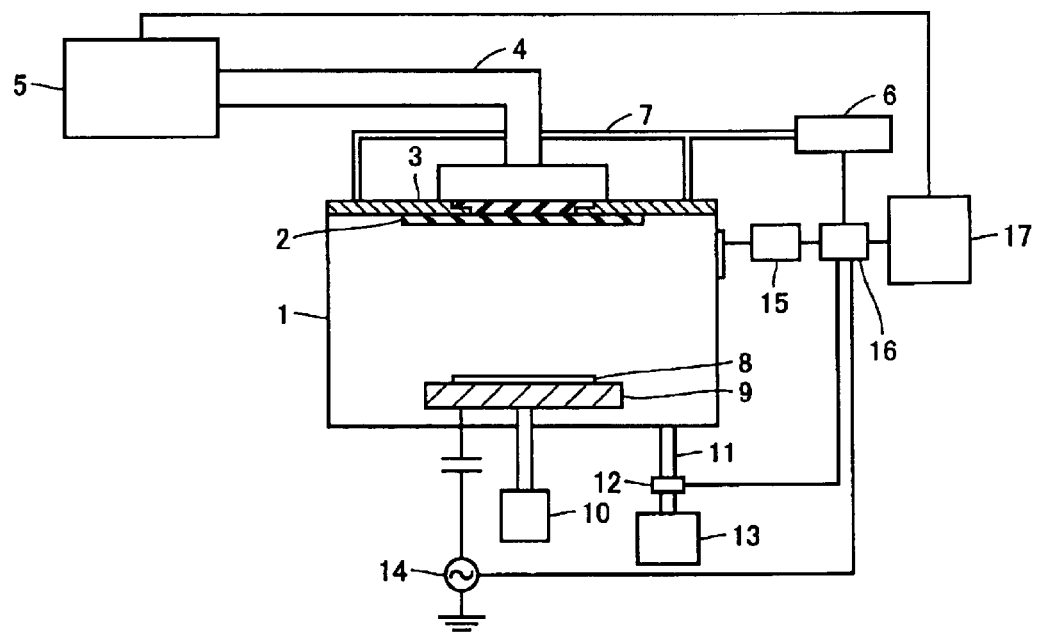
FIG. 6 is a schematic cross section showing a structure of a general plasma processing apparatus.

Referring to FIGS. 1 and 6, a plasma processing method according to a first embodiment of the present invention is described.

A substrate 8 with stacked films including a Ti-based thin film and an Al film that are to be processed is transported into a vacuum process chamber 1 (S1) and thereafter an ambient gas within vacuum process chamber 1 is discharged to produce a vacuum (S2). A first process gas is supplied into vacuum process chamber 1 in order to perform an etching process under a first plasma generating condition.

Figure 2:
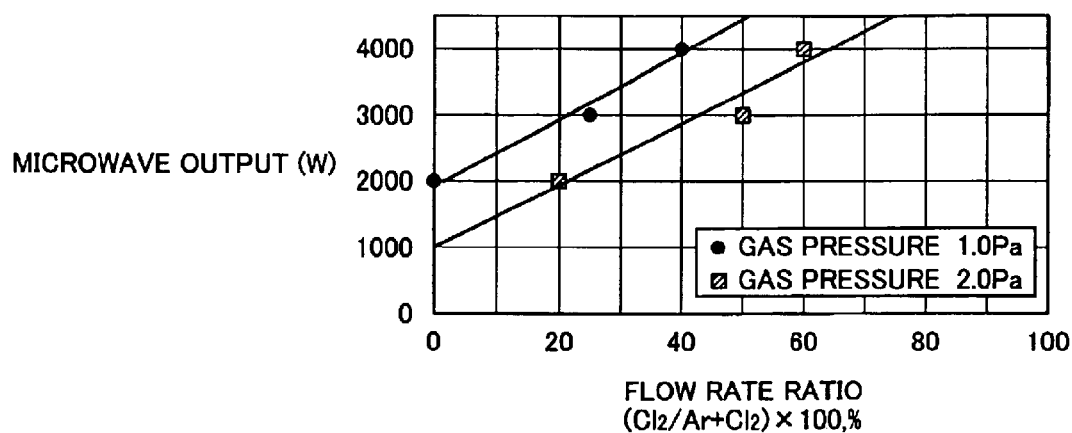
FIG. 2 shows a range which provides a stable plasma generation when a Ti-based thin film is etched.

When the Ti-based thin film is etched, a stable discharge is achieved under the condition represented by the range shown in FIG. 2. The vertical axis in FIG. 2 represents an output of microwave which is necessary for maintaining discharge while the horizontal axis represents a $Cl_2$ ratio. Referring to FIG. 2, as the $Cl_2$ ratio increases and the pressure of the process gas lowers, the microwave output required for keeping discharge increases. In other words, with the microwave output kept constant, if the $Cl_2$ ratio is raised or the process gas pressure is lowered, the discharge becomes unstable. Therefore, in order to maintain the stability in terms of discharge in a first etching process for etching the Ti-based thin film, the ratio between $Cl_2$ and Ar of the process gas is adjusted to 20:80.

Referring to FIGS. 1 and 6, the process gas with the mixture ratio described above is supplied into vacuum process chamber 1. After the pressure within vacuum process chamber 1 attains a predetermined pressure (S3), energy, which is microwave power for example, is radiated into vacuum process chamber 1. Accordingly, the process gas is excited to generate plasma used for etching the Ti-based thin film (S4). The end of etching for the Ti-based thin film is detected by measuring any change in the radiation intensity within vacuum process chamber 1 by means of an EPD (End Point Detector) (S5).

The EPD measures the intensity of light having a certain wavelength and determines that the etching has reached an end when any change of the radiation intensity exceeds a certain value. The radiation intensity changes due to a change, occurring nearly at the end of etching, in the amount of $Cl_2$ consumed in the etching process. When the end of etching is detected, the first plasma generating condition is automatically changed to a second plasma generating condition. Then, after the end is detected, transition from the first etching process to a second etching process automatically occurs.

Here, it is noted that, according to the conventional plasma processing method, the application of microwave power is stopped between the first etching and the second etching. On the other hand, according to the plasma processing method of the first embodiment, the plasma is maintained while the second etching process is started without stopping the application of microwave power (S6). In other words, simultaneously with the end of the first etching, supply of a second process gas into vacuum process chamber 1 is started. During this period, the energy such as microwave power is continuously radiated into vacuum process chamber 1 and thus the generated plasma is maintained.

Figure 7:
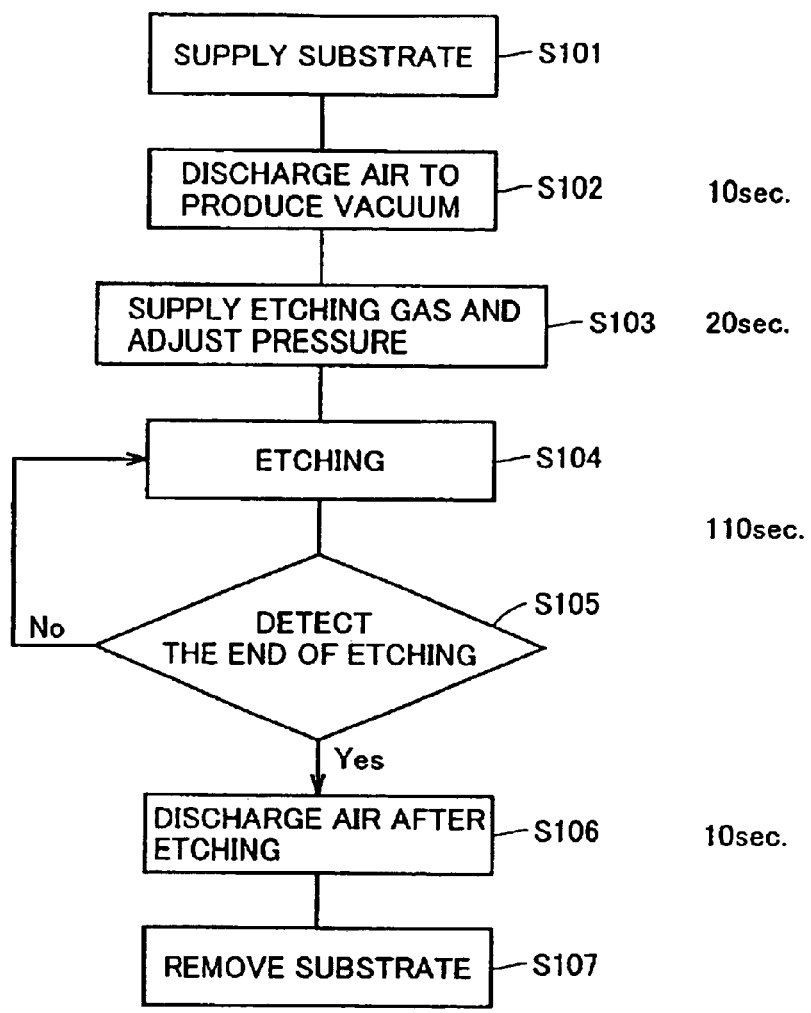
FIG. 7 is a flowchart illustrating a conventional plasma processing method.

It has been confirmed that a stable discharge can be ensured even if the $Cl_2$ ratio is high when the Al film is etched in the second etching process. Therefore, the second etching is carried out by using a process gas containing $Cl_2$ and Ar having the ratio therebetween of 80:20. In this process gas, the ratio of $Cl_2$ which contributes to etching is high, so that the etching rate for the Al film is higher than that of the conventional plasma processing method shown in FIG. 7.

Preferably, in the transition between the first and second etching processes, simultaneously with or prior to the change of the mixture ratio of the supplied process gas, the pressure within vacuum process chamber 1 as well as the output of plasma exciting power source 5 are also changed. Then, the process transition is accomplished while the generated plasma is maintained in a more stable state.

In this way, the second process of etching the Al film is started which is continued until the end of etching is detected by the EPD (S7). After the first and second etching processes, the air inside process chamber 1 is discharged to produce a vacuum (S8), and substrate 8 which has been processed is removed out of vacuum process chamber 1 (S9). The successive processes are accordingly completed.

As discussed above, according to the plasma processing method of the first embodiment, in the transition between the first and second etching processes, the generated plasma is maintained without stopping of the application of microwave power. Thus, the time required for extinguishment of plasma as well as regeneration thereof can be saved.

Figure 3:
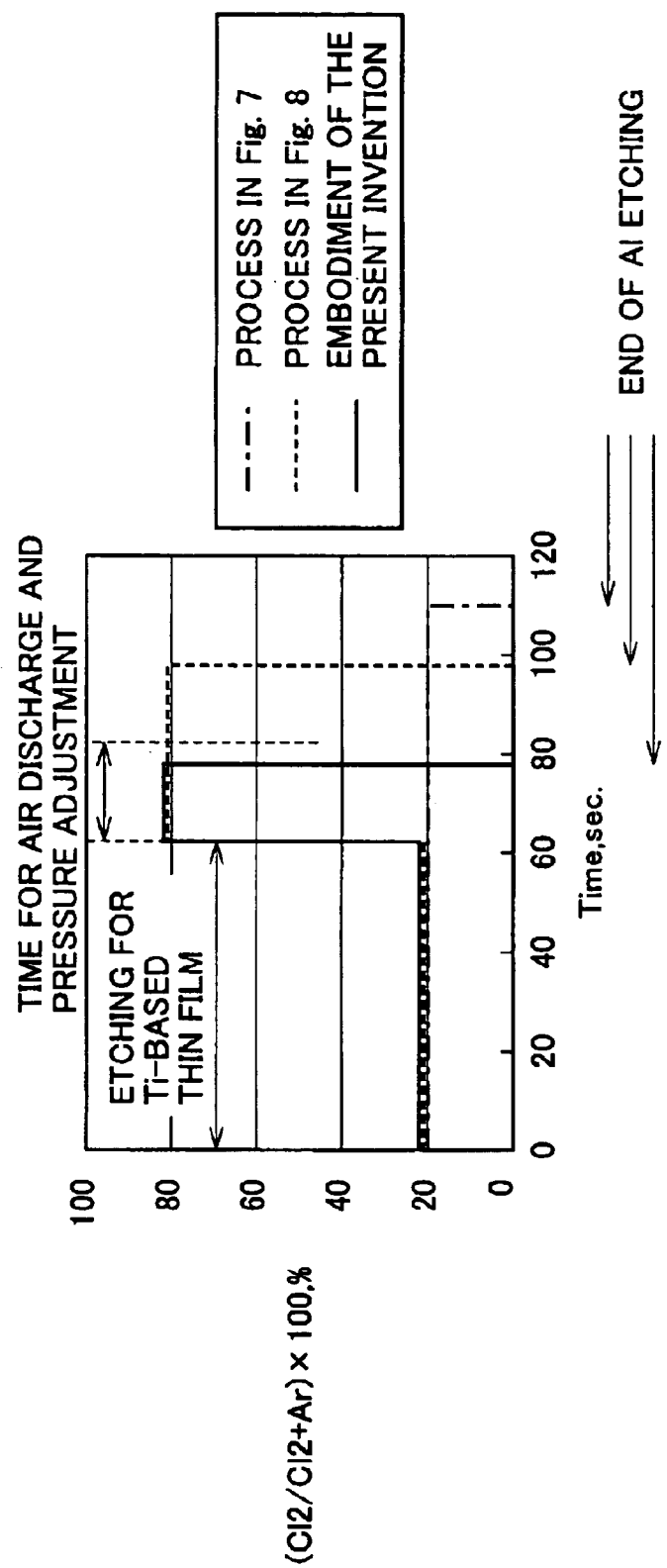
FIG. 3 shows process times of respective plasma processes to be compared with each other.
Figure 8:
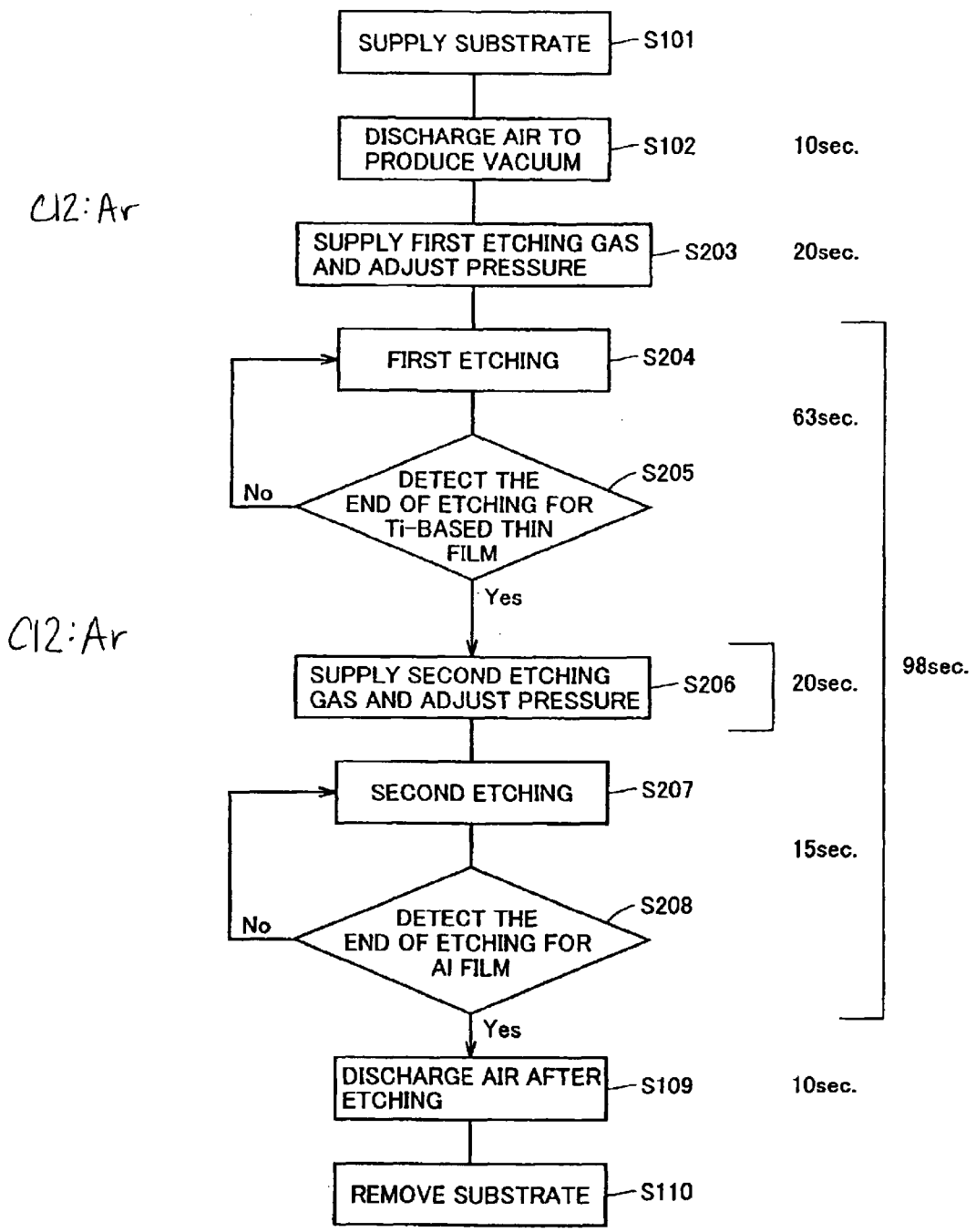
FIG. 8 is a flowchart illustrating a plasma processing method disclosed in Japanese Patent Laying-Open No. 11-111702.

The time required for each of the plasma processes respectively of the first embodiment and the conventional methods is measured and resultant measurements are shown in FIG. 3. It is seen from FIG. 3 that the time required for the plasma process of the first embodiment is shorter by 32 seconds than that of the process in FIG. 7 and shorter by 20 seconds than that of the process in FIG. 8.

Second Embodiment

Figure 4:
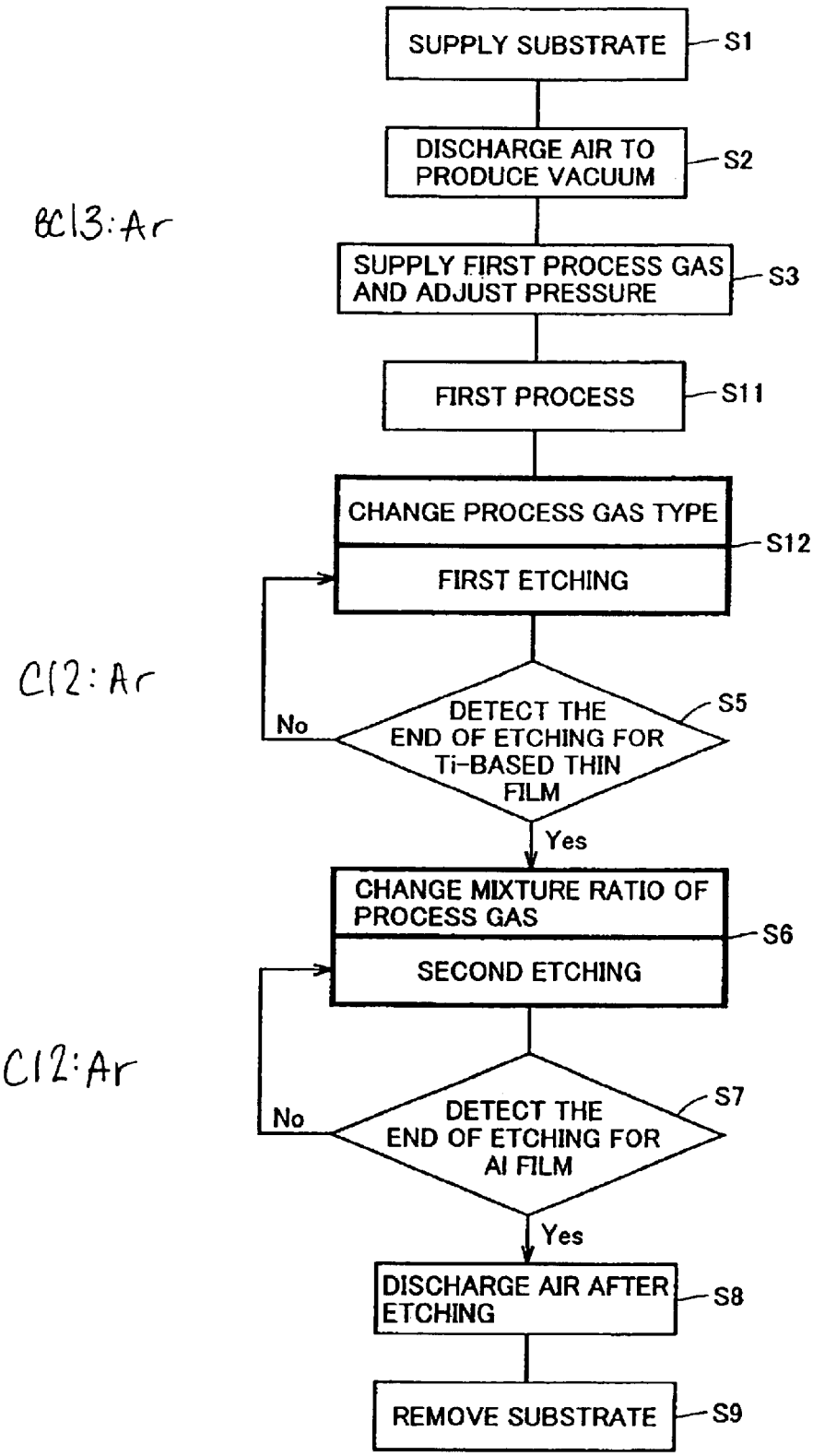
FIG. 4 is a flowchart illustrating a plasma processing method according to a second embodiment of the present invention.

Referring to FIGS. 4 and 6, a second embodiment of the present invention is described according to which the type of gas is changed in a plasma generation period.

A substrate 8 with stacked films including a Ti-based thin film and an Al film is provided (S1), and an ambient gas within process chamber 1 is thereafter discharged (S2) as done for the first embodiment. Then, a mixture gas of $BCl_3$ and Ar is supplied as a first process gas into vacuum process chamber 1. This gas is supplied for the purpose of removing any quality-altered layer such as an oxide film, which is formed on the surface of a layer (metal layer) to be processed on substrate 8, and thus exposing the surface of the metal layer. Specifically, $BCl_3$ having a relatively great molecular weight is used for a plasma process to cause ions to impact against the surface of the altered layer thereby etch and remove the altered layer.

The first process gas is thus supplied and the pressure within vacuum process chamber 1 attains a predetermined value (S3). Then, any energy such as microwave power is radiated into vacuum process chamber 1. The process gas within vacuum process chamber 1 is accordingly excited to produce plasma and the surface altered layer is etched in a first process (S11). The first process for etching the surface altered layer is continued for a predetermined time. Then, simultaneously with the end of this etching, supply of a second process gas is started while the plasma is maintained, and a second process is started (S12). The second process gas is a mixture gas of $Cl_2$ and Ar by which the metal layer is actually etched (first etching).

Subsequent steps S5 and S6 similar to those of the first embodiment are carried out and accordingly, the successive plasma processes are completed.

It has been confirmed through experiments that, regarding the second embodiment, the discharge caused by the mixture gas of $BCl_3$ and Ar used for the first process removes the surface altered layer while the metal layer is not substantially etched away by the mixture gas. Therefore, such a sudden change of the gas type in the plasma generation period does not affect the shape produced by the etching.

In this way, the gas type is changed in the plasma generation period. Then, application of the microwave power is never stopped in the transition between the first process and the second process. The time required for extinguishment of the plasma and regeneration thereof can be saved to improve the processing speed.

Figure 5:
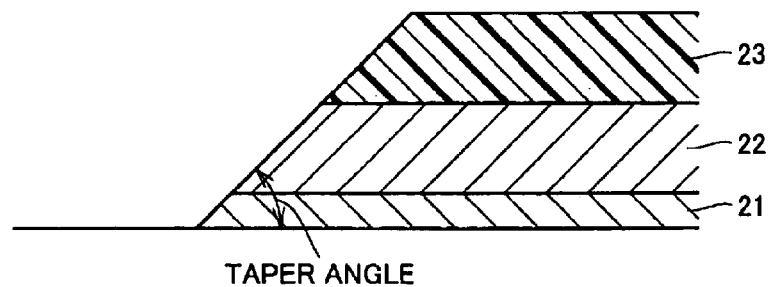
FIG. 5 illustrates a taper angle formed by sidewalls of processed films.

However, when the mixture ratio or the type of the process gas is changed depending on the film to be processed, the etching rate as well as the ratio of etching selectivity between a resist and stacked films are also changed. As shown in FIG. 5, etched films (Ti-based thin film 22 and Al film 21) have sidewalls forming a tapered portion. This tapered portion has a shape (i.e., taper angle) which changes according to the change in the process gas. Here, the taper angle refers to the angle formed between the underlying surface and the sidewalls of stacked films 21 and 22. The taper angle increases when the etching rate for metal stacked films 21 and 22 is higher than that for a photo resist 23 and decreases when the etching rate for stacked films 21 and 22 is lower than that for photo resist 23. The increase of the taper angle is likely to cause current leakage when an interconnection is formed in an upper layer of the stacked films in a subsequent process. Therefore, control of the taper shape is necessary in addition to the enhancement of the processing speed. Then, if it is highly probable that any change made in the mixture ratio or type of the supplied process gas affects the taper shape, a change is simultaneously made in bias output, in order to control the taper shape and produce a desired shape.

Specifically, when the bias output is increased, ions contributing to etching are more strongly be drawn, which physically promotes etching. Here, metal films 21 and 22 are etched through a chemical reaction while photo resist 23 tends to be physically etched. Therefore, if the bias output is increased, the etching rate for photo resist 23 becomes higher so that the taper angle decreases.

It has actually be confirmed that the increase of the applied bias output lowers the ratio of etching selectivity between photo resist 23 and metal layers 21 and 22 so that the taper angle decreases. From an experiment, it has been confirmed that the bias output increased from 1.0 kW to 1.6 kW decreases the taper angle by 5° to 10°.

In addition, the pressure of the process gas is preferably the same for respective plasma generating conditions for the first and second etching. However, even if different process gas pressures are used for these plasma generating conditions respectively, the time required for adjusting the pressure in the plasma generation period is merely 3 seconds or shorter. Such a change in the pressure does not influence the taper shape.

As heretofore described, according to the plasma processing method of the present invention, the discharge conditions are varied according to the state of the substrate surface for the purpose of achieving a speedily and stable plasma process as well as control of a dry-etched shape.

It is noted that a film or the like to be etched by the plasma processing method of the present invention is not limited to specific ones described above. In addition, the gas type is not limited to the above-described ones. Moreover, the plasma processing method of the present invention is not limited to the embodiments above and is applicable to an RIE (Reactive Ion Etching) apparatus and an ICP (Inductively Coupled Plasma) apparatus, for example.

According to the first embodiment discussed above, the mixture ratio of the process gas is changed in the transition between the first and second etching. Alternatively, the type of process gas may be changed. Similarly, instead of changing the type of process gas in the transition between the first and second embodiment according to the second embodiment, the mixture ratio may be changed here.

According to the plasma processing method of the present invention as described above, a plurality of plasma processes are successively conducted in the same vacuum process chamber under different discharge conditions. Here, any process except for the main plasma processes, such as the process of stopping of the plasma excitation power, can be avoided. Accordingly, the processing speed can be enhanced without deterioration of plasma stability. Moreover, it is possible to control the taper shape formed by sidewalls of dry-etched films according to the plasma processing method described above.

The plasma processing method of the present invention enables the total time for the entire plasma process to be decreased and thus this method is remarkably advantageous for improvement of productivity of multi-layer integrated circuits and magnetic recording devices, for example.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A plasma processing method using a process gas supplied into a process chamber to generate plasma from the process gas and process a substrate placed in said process chamber by means of the plasma, wherein
   said substrate includes stacked films of at least two types to be etched by the plasma, and,
   when said substrate is etched by the plasma in a plasma generation period and a change is made in plasma generating condition according to any of said films that are to be etched, said plasma generating condition for stably maintaining generation of the plasma is first changed and thereafter a change is made in said process gas.

2. The plasma processing method according to claim 1, wherein
   said plasma generating condition for stably maintaining generation of the plasma is pressure of the process gas within said process chamber.

3. The plasma processing method according to claim 1, wherein
   said plasma generating condition for stably maintaining generation of the plasma is output of a plasma exciting power source.

4. The plasma processing method according to claim 1, wherein
   in the plasma generation period, a change is made in a bias voltage applied to said substrate, together with the change made in said process gas.

5. A plasma processing method using a process gas supplied into a process chamber to generate plasma from the process gas and process a substrate placed in said process chamber by means of the plasma, wherein
   said substrate includes stacked films of at least one Ti-based film and at least one film other than a Al-based film to be etched by the plasma, and,
   when the substrate is etched by the plasma in a plasma generation period and a change is made in plasma generation condition according to any of the films that are to be etched, a plasma generating condition for stably maintaining the plasma is first changed, and thereafter a change is made in said process gas.

6. The plasma processing method according to claims 5, wherein at least one film other than an Al-based film is an Ti-based film.

7. The plasma processing method according to claim 5, wherein the process gas includes a mixture of $Cl_2$ and Ar.

8. The plasma processing method according to claim 5, wherein in the plasma generation period, a change is made in a bias voltage applied to said substrate, together with the change made in said process gas.

9. A plasma processing method comprising the steps of:

placing in a process chamber a substrate to be processed that has stacked films;

performing first etching with plasma on said stacked films by supplying a first process gas into said process chamber;

completing said first etching without extinguishing said plasma; and performing second etching with plasma on said stacked films by supplying a second process gas different from said first process gas into said process chamber, wherein when the substrate is etched by said first etching and said second etching in a plasma generation period a change is made in plasma generating condition such that a plasma generating condition for stably maintaining generation of the plasma is first changed and thereafter the process gas is changed from said first process gas to said second process gas.

10. A method of manufacturing a semiconductor device by the plasma processing method according to claim 9, wherein said substrate to be processed is a semiconductor substrate and said stacked films of said semiconductor substrate are etched by said plasma processing method.

11. A method of manufacturing a liquid-crystal display device by the plasma processing method according to claim 9, wherein said substrate to be processed is a substrate of the liquid-crystal display device and said stacked films of said substrate of the liquid-crystal display device are etched by said plasma processing method.

* * * * *